(12) United States Patent
Terenzio et al.

(10) Patent No.: US 10,045,452 B2
(45) Date of Patent: Aug. 7, 2018

(54) ELECTRONIC DEVICE STRUCTURES AND METHODS OF MAKING

(71) Applicant: Micron Technology, Inc., Boise, ID (US)

(72) Inventors: Dennis M. Terenzio, Boise, ID (US); Kurt B. Smith, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/291,619

(22) Filed: Oct. 12, 2016

(65) Prior Publication Data
US 2018/0103555 A1 Apr. 12, 2018

(51) Int. Cl.
| H05K 5/02 | (2006.01) |
| H05K 5/03 | (2006.01) |
| H05K 7/14 | (2006.01) |
| H01R 12/72 | (2011.01) |
| H01R 24/66 | (2011.01) |
| H01R 107/00 | (2006.01) |

(52) U.S. Cl.
CPC .......... H05K 5/026 (2013.01); H01R 12/721 (2013.01); H01R 24/66 (2013.01); H05K 5/03 (2013.01); H05K 7/1418 (2013.01); *H01R 2107/00* (2013.01)

(58) Field of Classification Search
CPC ........ H05K 5/026; H05K 7/1418; H05K 5/03; H05K 7/1425; H01R 24/66; H01R 12/721; H01R 2107/00
See application file for complete search history.

(56) References Cited

U.S. PATENT DOCUMENTS

| 5,839,907 A | * | 11/1998 | Kuo | G06K 19/077 439/76.1 |
| 5,926,374 A | * | 7/1999 | Onoda | H05K 5/0269 206/706 |

(Continued)

FOREIGN PATENT DOCUMENTS

JP 2002334570 A 11/2002

OTHER PUBLICATIONS

International Search Report from International Application No. PCT/US2017/056108, dated Jan. 15, 2018, 3 pages.

(Continued)

*Primary Examiner* — Dimary Lopez Cruz
*Assistant Examiner* — Abhishek Rathod
(74) *Attorney, Agent, or Firm* — TraskBritt

(57) ABSTRACT

Electronic device structures may include a sleeve member including a cavity extending from a first end of a body toward a second, opposite end, and an opening in communication with the cavity at the first end of the sleeve member. A frame configured to engage an electronic device member, such as a substrate bearing electronic components, may be sized and shaped to be positioned at least partially in the cavity. The frame may include a connector interface at a first end of the frame, the connector interface sized and shaped to at least partially occlude the opening and to accommodate a portion of the substrate extending therethrough and comprising a blade bearing electrical contacts. Support members may extend from proximate the connector interface toward a second end of the body within the cavity when the frame is located at least partially in the cavity.

29 Claims, 7 Drawing Sheets

(56) References Cited

U.S. PATENT DOCUMENTS

| | | | | |
|---|---|---|---|---|
| 6,091,605 A * | 7/2000 | Ramey | ............... | H05K 5/0269 |
| | | | | 361/737 |
| 6,527,188 B1 * | 3/2003 | Shobara | ............... | G06K 7/0013 |
| | | | | 235/486 |
| 6,817,782 B2 * | 11/2004 | Togami | ............... | G02B 6/4277 |
| | | | | 385/89 |
| 6,891,721 B2 * | 5/2005 | Huang | ............... | G11B 25/043 |
| | | | | 361/679.33 |
| 7,489,505 B2 * | 2/2009 | Hong | ............... | G11B 33/12 |
| | | | | 206/307 |
| 8,045,325 B2 * | 10/2011 | Weng | ............... | G06F 1/187 |
| | | | | 361/679.33 |
| 8,951,070 B1 | 2/2015 | Goodwin | | |
| 9,301,415 B2 | 3/2016 | Goodwin et al. | | |
| 2006/0274505 A1 * | 12/2006 | Yeh | ............... | G11B 33/124 |
| | | | | 361/704 |
| 2007/0133166 A1 * | 6/2007 | Hong | ............... | G11B 33/12 |
| | | | | 361/679.32 |
| 2008/0132119 A1 | 6/2008 | Daubigney et al. | | |
| 2008/0158808 A1 * | 7/2008 | Camarena | ............... | G06F 1/187 |
| | | | | 361/679.34 |
| 2009/0063895 A1 | 3/2009 | Smith | | |
| 2011/0201218 A1 | 8/2011 | Leroux et al. | | |
| 2011/0228468 A1 * | 9/2011 | Weng | ............... | G06F 1/181 |
| | | | | 361/679.33 |
| 2012/0244741 A1 | 9/2012 | Lim et al. | | |
| 2015/0144383 A1 | 5/2015 | Goodwin | | |

OTHER PUBLICATIONS

International Written Opinion from International Application No. PCT/US2017/056108, dated Jan. 15, 2018, 8 pages.

* cited by examiner

ELECTRONIC DEVICE STRUCTURES AND METHODS OF MAKING

FIELD

This disclosure relates generally to configurations for electronic device structures, including enclosures and connectors for electronic devices. More specifically, disclosed embodiments relate to electronic devices (e.g., Solid State Drives (SSDs), Hard Disk Drives (HDDs), Digital Versatile Disc (DVD) drives, Compact Disc (CD) drives, graphics cards, television tuner cards) that may integrate various portions of standardized operational connections (e.g., Serial Advanced Technology Attachment (SATA), Peripheral Component Interconnect (PCI), Peripheral Component Interconnect Express (PCIe)) into components of the devices, such as electronic device members (e.g., Printed Circuit Boards (PCBs), motherboards, packlayers, integrated circuits) and enclosures thereof.

BACKGROUND

Standardized operational connections, such as those mentioned above, are frequently manufactured separately from the electronic devices of which they will ultimately form a part. For example, SATA, PCI, and PCIe connectors, including the electrically conductive contacts and the geometrical interface thereof, are typically provided as a separate component to be soldered or otherwise electrically and mechanically connected to an electronic device.

Some have attempted to provide alternatives to dedicated connector components. For example, U.S. Pat. No. 8,951,070, issued Feb. 15, 2015, to Goodwin, discloses a connector scheme wherein the electrical contacts of the connector are integrated into a PCB and the geometrical interface of the connector is provided as a separate component that may be slid over the electrical contacts to form the connector. As another example, U.S. Pat. No. 9,301,415, issued Mar. 29, 2016, to Goodwin et al., discloses another scheme wherein the electrical contacts of the connector are integrated into the PCB, the geometrical interface of the connector is integrated into an underlying tray of the device enclosure, and an overlying portion of the device enclosure is secured over the tray to complete the device.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

The illustrations presented in this disclosure are not meant to be actual views of any particular electronic device, enclosure or assembly therefor, or component thereof, but are merely idealized representations employed to describe illustrative embodiments. Thus, the drawings are not necessarily to scale.

Disclosed embodiments relate generally to electronic device structures that may integrate various portions of standardized operational connections into other components of the device structures, such as electronic device members and enclosures thereof. More specifically, disclosed are embodiments of electronic device structures that may integrate at least a portion of the geometrical interface of a standardized electrical connector into a frame configured to support an electronic device member and form at least a portion of an enclosure, and may enable a remainder of the enclosure to include rigid materials, and to include a cavity receiving the frame and a supported electronic device member and having one or more openings at least partially occluded by a portion of the frame. As a result, the physical connection points for data, ground and power and the keying features for connecting the electronic device to a mating connector are configured as separate parts. The keying features for engaging a mating connector becomes either part of the enclosure or part of an electronic device member, and the power, ground and data connectors comprise a portion of the electronic device member, and specifically of a substrate of the electronic device member carrying electronic components.

As used in this disclosure, the terms "upper" and "lower" refer to the orientation depicted in the associated figures, and are not meant to limit the orientation of the device during fabrication or use. For example, an upper surface refers to the upper surface depicted in the associated drawing, but the same surface may ultimately be oriented sideways or downward during fabrication or use of the device.

Figure 1:
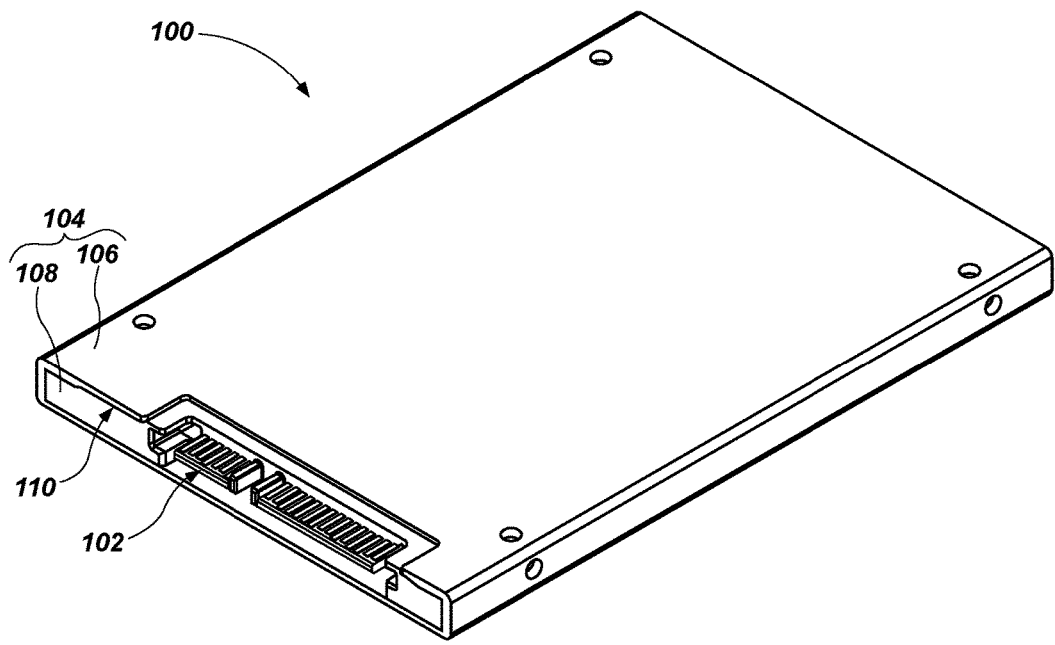
FIG. 1 is a perspective view of an electronic device.

Referring to FIG. 1, a perspective view of an electronic device structure 100 is shown. The electronic device structure 100 may include an electronic device member 102 and an enclosure 104 supporting and partially containing the electronic device member 102. The enclosure 104 may include a sleeve member 106 and a frame 108 at least partially located within a cavity 110 extending into the sleeve member 106. The frame 108 may support and position the electronic device member 102 relative to the sleeve member 106 such that a portion of the electronic device member 102 is located within the cavity 110 and another portion of the electronic device member 102 extends from the cavity 110, through the frame 108, to be exposed at an exterior of the electronic device structure 100. Each of these components and their relationships to one another is described in greater detail below.

In the embodiment shown in FIG. 1, the electronic device structure 100 is configured as a nontransitory memory device, such as an SSD or an HDD. In other embodiments, electronic devices within the scope of this disclosure include DVD drives, CD drives, graphics cards, television tuner cards, and other electronic devices having enclosures and utilizing standardized operational connectors. Modifications to the electronic device structure 100 shown in FIG. 1 to fabricate such other electronic devices may include, but are not limited to, providing access to an interior of the enclosure to enable insertion of media (e.g., DVDs, CDs, etc.), modifying the specifics of the standardized operational connector (e.g., to exhibit the characteristics required by SATA, PCI, PCIe, etc.), and modifying the functional components and interconnections thereof to perform the desired tasks.

Figure 2:
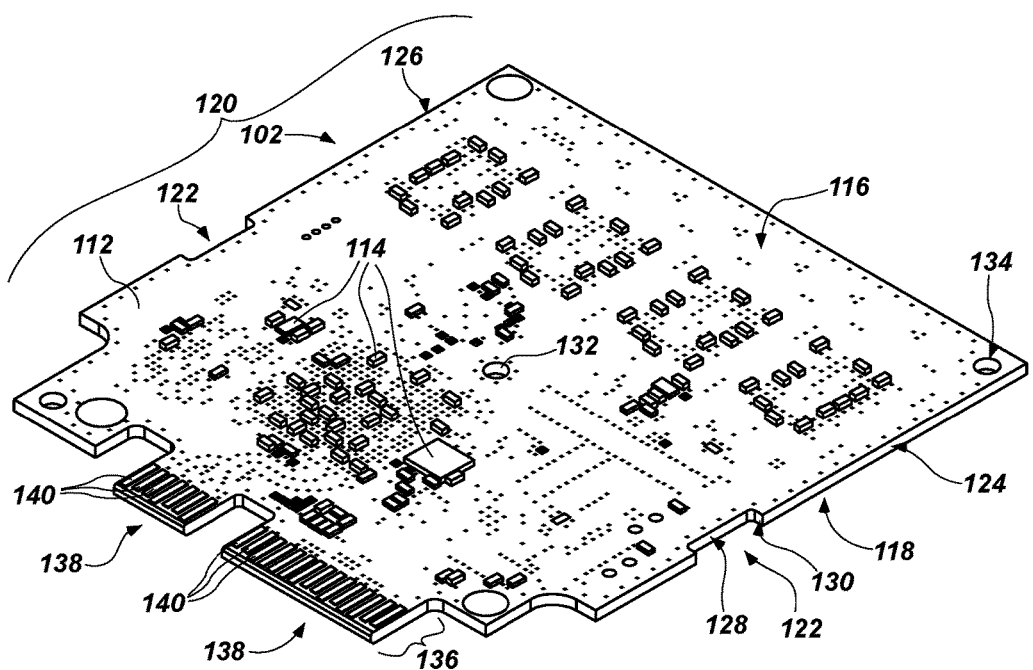
FIG. 2 is a perspective view of an electronic device member of the electronic device of FIG. 1.

FIG. 2 is a perspective view of the electronic device member 102 of the electronic device structure 100 of FIG. 1. The electronic device member 102 may include a substrate 112 sized and shaped to be partially positioned within the cavity 110 (see FIG. 1) of the sleeve member 106 (see FIG. 1). The substrate 112 may include, for example, a PCB, motherboard, packlayer, integrated circuits, etc. Discrete electronic components 114 (e.g., circuitry) may be supported on the substrate 112. In some embodiments, the electronic components 114 may be located on both an upper surface 116 and a lower surface 118 on an opposite side of the substrate 112. In other embodiments, the electronic components 114 may be isolated on one of the upper surface 116 and the lower surface 118. The electronic components 114 may be cooperatively configured, and operatively connected, to perform the functional duties of the electronic device structure 100, such as, for example, storing data in nontransitory memory, reading data storage means (e.g., DVDs, CDs, etc.), and processing received data and controlling connected devices (e.g., operating as a graphics card, sound card, television tuner card, etc.). The electronic components 114 may include, for example, semiconductor devices (e.g., processors, microprocessors, memory, etc.), resistors, capacitors, inductors, batteries, sensors, emitters (e.g., lasers), magnetic discs, and optical discs. The substrate 112 may include wiring, such as, for example, electrically conductive traces on the upper surface 116 or lower surface 118 of, or embedded in one or more layers within, the substrate 112 to interconnect the electronic components 114 to one another.

The substrate 112 may include a first portion 120 sized and shaped to be located within the cavity 110 (see FIG. 1) of the sleeve member 106 (see FIG. 1). The first portion 120 may be generally rectangular when viewed facing one of the upper and lower surfaces 116 and 118. At least a majority of the electronic components 114 may be located on the first portion 120 of the substrate 112.

The first portion 120 may include a notch 122 extending into the substrate 112 from two lateral surfaces 124 and 126 on opposite lateral sides of the substrate 112 to enable the substrate 112 to be secured to the frame 108 (see FIG. 1), the sleeve member 106 (see FIG. 1), or both. Each notch 122 may include an inset lateral surface 128 extending at least substantially parallel to the two lateral surfaces 124 and 126 of the substrate 112 and two motion-delimiting surfaces 130 extending (e.g., at least substantially perpendicular to the lateral surfaces 124 and 126, at an oblique angle thereto, or exhibiting an arcuate or stepped transition) from the respective lateral surface 124 or 126 to the inset lateral surface 128.

The first portion 120 may include at least one hole extending therethrough to enable the substrate 112 to be secured to the frame 108 (see FIG. 1), the sleeve member 106 (see FIG. 1), or both or to accommodate inserted members (e.g., posts, screws, pins, bolts, etc.). For example, the first portion 120 may include a first hole 132 located proximate a geometrical center of the substrate 112 to enable a direct, mechanical connection between the substrate 112 and the sleeve member 106 (see FIG. 1). In some embodiments, the first hole 132 may be configured to engage with a received member, such as, for example, by being threaded to engage with threads of a screw or bolt. Continuing the example, the first portion 120 may further include at least one additional hole 134 located proximate a periphery of the substrate 112 (e.g., proximate one or more corners thereof) to enable received members to pass therethrough, such as, for example, pins, screws, or bolts that may extend from an exterior of the electronic device structure 100 to an interior thereof to secure the electronic device structure 100 (see FIG. 1) to another structure (e.g., to a computer case).

The substrate 112 may include a second portion 136 sized, shaped, and positioned to extend from within the cavity 110 (see FIG. 1), through the frame 108 (see FIG. 1), to be exposed at an exterior of the electronic device structure 100 (see FIG. 1). The second portion 136 may further be sized, shaped, positioned, and otherwise configured to serve as one or more blades 138 of an operational connector, as specified in the requirements for a standardized operational connector, such as, for example, SATA, PCI, PCIe, etc. Each blade 138 may include, for example, electrical contacts 140 (e.g., pads, traces, fingers, etc., of electrically conductive material, such as, for example, copper, gold, solder, etc.) thereon. The electrical contacts 140 may be sized, shaped, positioned, of a quantity, and of an electrical and operational configuration required for the selected, standardized operational connector. The electrical contacts 140 may be electrically and operatively connected to the electronic components 114 on the substrate 112 via the aforementioned wiring. Integrating the blades 138 and electrical contacts 140 of a standardized operational connector into the substrate 112 of the electronic device member 102, rather than providing a dedicated connector that is then soldered to the electronic device member 102, may reduce fabrication cost, improve signal quality, and reduce introduction of signal noise.

Figure 3:
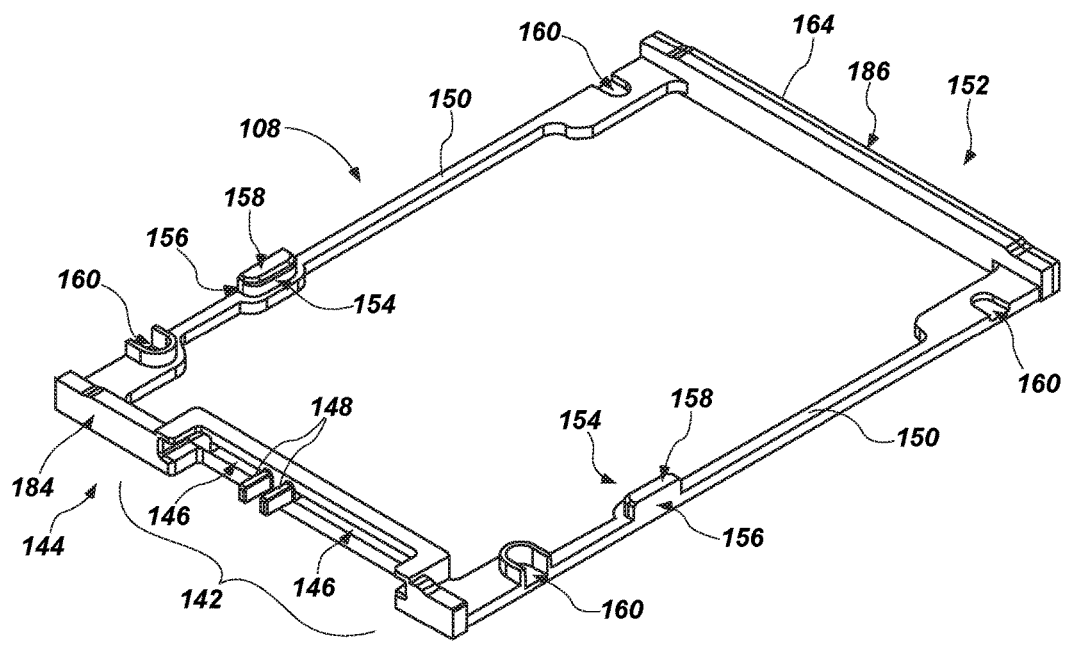
FIG. 3 is a perspective view of a frame of the electronic device of FIG. 1.

FIG. 3 is a perspective view of the frame 108 of the electronic device structure 100 of FIG. 1. The frame 108 may be sized and shaped to be positioned at least partially in the cavity 110 (see FIG. 1) of the sleeve member 106 (see FIG. 1). The frame 108 may include a connector interface 142 at a first end 144 of the frame 108. The connector interface 142 may be sized and shaped to mate with a mating connector (e.g., of a SATA cable, a PCI slot, a PCIe slot, etc.) to operatively connect the mating connector to the electronic device member 102 (see FIGS. 1, 2). As specific, nonlimiting examples, the connector interface 142 may exhibit a size, shape, and configuration specified in at least one of SATA Specification Revisions 1.0, 2.0, 3.0, 3.2, and 3.3.

The connector interface 142 may include, for example, one or more slots 146 sized, shaped, and positioned to enable the one or more blades 138 (see FIG. 2) of the second portion 136 (see FIG. 2) of the electronic device member 102 (see FIG. 2) to pass therethrough. The connector interface 142 may further include geometrical keying features to orient and mechanically connect to the mating connector. For example, the connector interface 142 may include guide tabs 148 sized, shaped, and positioned to be received into corresponding slots in the mating connector. The guide tabs 148 may be, for example, of a rectangular shape and may extend from proximate the slot 146 or slots 146 away from the cavity 110 (see FIG. 1). In some embodiments, the guide tabs 148 may be an integral portion (e.g., may be integrally formed with a remainder of) the frame 108, as shown in FIG. 3, for example, in an injection molding process. In other embodiments, the guide tabs 148 may be an integral portion or may be secured to the substrate 112 (see FIG. 2) of the electronic device member 102 (see FIG. 2), as shown and described in connection with FIGS. 8 and 9. In some such embodiments, the frame 108 may lack guide tabs 148 integrated thereinto, as shown and described in greater detail in connection with FIGS. 10 and 11.

The frame 108 may include mutually parallel support members 150 extending perpendicular to, and from, proximate the connector interface 142 toward a second, opposite end 152 of the frame 108. The frame 108, including at least the connector interface 142 and the support members 150 may be configured to mechanically support the electronic device member 102. For example, each support member 150 may include a retaining connector 154 sized, shaped, and positioned to engage with the notch 122 (see FIG. 2) on a corresponding side of the electronic device member 102 to secure the electronic device member 102 (see FIG. 2) to the frame 108. The retaining connectors 154 may include, for example, tabs, hooks, clips, or other structures configured to engage with the notches 122 (see FIG. 2) to secure the electronic device member 102 (see FIG. 2) to the frame 108. More specifically, each retaining connector 154 may include a first portion 156 extending upward from the corresponding support member 150 and an optional second portion 158 extending laterally toward the other support member 150 at a height sufficient to receive the substrate 112 (see FIG. 2) of the electronic device member 102 (see FIG. 2) into the space between the support member 150 and the second portion 158 of the retaining connector 154. In addition, the first portion 156 of each retaining connector 154 may be sized, shaped, and positioned to be received at least partially into the corresponding notch 122 (see FIG. 2), such that mechanical interference between the inset lateral surface 128 (see FIG. 2) and motion-delimiting surfaces 130 of a notch 122 (see FIG. 2), and first portion 156 may restrain relative movement between the frame 108 and the electronic device member 102 (see FIG. 2).

In some embodiments, the frame 108 may include one or more accommodation structures 160 sized, shaped, and positioned to receive at least a portion of an inserted member within the cavity 110 (see FIG. 1). For example, the accommodation structures 160 may include recesses sized, shaped, and positioned to receive pins, screws, bolts, or other connection members extending through the sleeve member 106 (see FIG. 1) into the cavity 110 (see FIG. 1), such as those connecting members used to secure the electronic device structure 100 (see FIG. 1) to a drive bay in a computer case.

In some embodiments, such as that shown in FIG. 3, the frame 108 may include a backstop 164 at the second end 152 of the frame 108, perpendicular to and connected to support members 150. The backstop 164 may be a mass of material sized, shaped, and positioned to form at least a portion of a rear surface of the electronic device structure 100. In embodiments where the electronic device is configured to perform another function requiring introduction of another medium into the electronic device, such as, for example, inserting a DVD or CD into the corresponding drive, the backstop 164 may be configured with an opening appropriately sized and shaped to receive the particular medium.

The frame 108 may comprise a resilient material enabling its support members 150 to bend and bow outward during assembly with the substrate 112, and return to their original position after release and engagement with the substrate 112. For example, the frame 108 may comprise a polymer material (e.g., injection-molded plastic).

Figure 4:
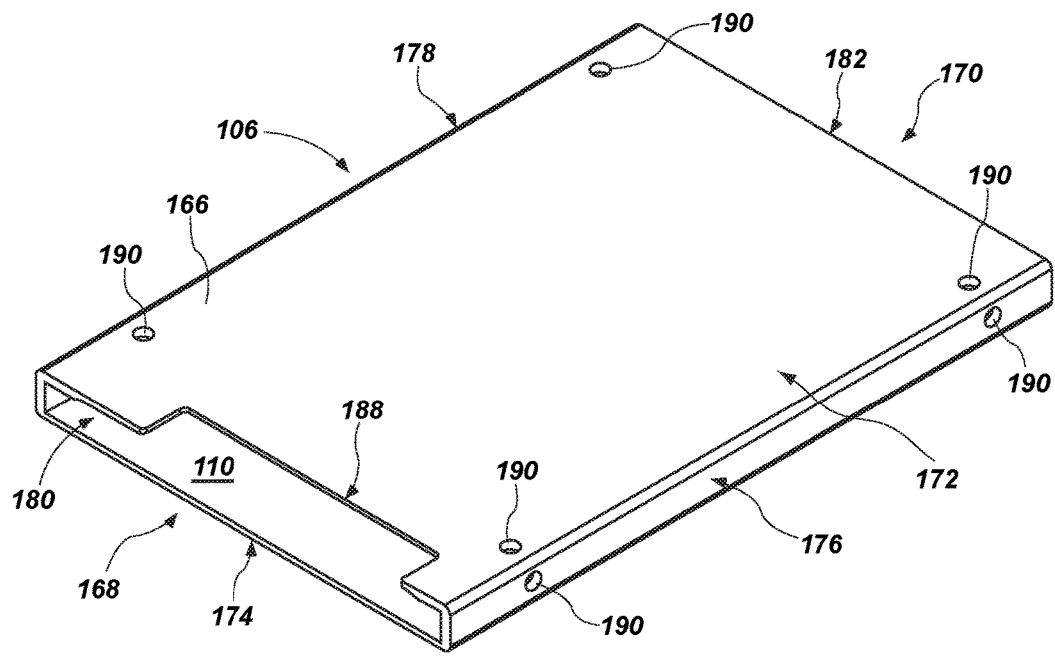
FIG. 4 is a perspective view of an enclosure of the electronic device of FIG. 1.

FIG. 4 is a perspective view of the sleeve member 106 of the enclosure 104 of the electronic device structure 100 of FIG. 1. The sleeve member 106 may include a body 166 and comprises a first end 168, a second, opposite end 170, and an upper portion 172, a lower portion 174, and optional sidewalls 176 and 178 extending between the ends 168 and 170. The sleeve member 106 may include the cavity 110 extending into the body 166 defined by the inner surfaces of the upper portion 172, lower portion 174, and optional sidewalls 176 and 178. The sleeve member 106 may include an opening 180 at the first end 168 in communication with the cavity 110. In some embodiments, such as that shown in FIG. 4, the sleeve member 106 may include another opening 182 at the second end 170 in communication with the cavity 110. More specifically, the sleeve member 106 may exhibit a tubular rectangle shape, such that the upper portion 172, lower portion 174, and optional sidewalls 176 and 178 have a rectangular cross-sectional shape and the cavity 110 has a smaller rectangular cross-sectional shape extending entirely through the body 166. As a specific, nonlimiting example, the sleeve member 106 may be a section of an extruded, tubular, rectangular mass of material, such as, for example, a metal or metal alloy.

The first end 144 (see FIG. 3) of the frame 108 (see FIG. 3), including the connector interface 142 (see FIG. 3), may be sized and shaped to at least partially occlude the opening 180 at the first end 168 of the body 166. For example, the first end 144 (see FIG. 3) of the frame 108 (see FIG. 3) may include a first surface 184 (see FIG. 3) filling the portions of the opening 180 not occupied by the connector interface 142. The second end 152 (see FIG. 3) of the frame 108 (see FIG. 3), including the backstop 164 (see FIG. 3), may similarly be sized and shaped to at least partially occlude the other opening 182 at the second end 170 of the body 166. For example, the backstop 164 (see FIG. 3) may include a second surface 186 (see FIG. 3) filling the other opening 182. In this way, the frame 108 (see FIG. 3) may function as a portion of a standardized operational connector utilizing the connector interface 142 (see FIG. 3), an internal support structure for the electronic device member 102 (see FIG. 2), and a portion of the exposed exterior of the enclosure 104 (see FIG. 1).

The sleeve member 106 may include a cutout 188 in at least one of the upper and lower portions 172 and 174 to better accommodate the connector interface 142 (see FIG. 3). For example, the sleeve member 106 may include a rectangular cutout 188 extending from the first end 168 toward the second end 170, the cutout 188 being sized, shaped, and positioned to at least substantially align with the connector interface 142 (see FIG. 3) of the frame 108 (see FIG. 3) when the frame 108 is inserted into the cavity 110. The cutout 188 enables the connector interface 142 (see FIG. 3) and blades 138 (see FIG. 2) to remain recessed relative to the first end 168, such that they may not extend therebeyond. Such a configuration may physically protect the connector interface 142 (see FIG. 3) and blades 138 (see FIG. 2), for example, during handling and prior to engagement with a mating connector.

In some embodiments, such as that shown in FIG. 4, the sleeve member 106 may include one or more holes 190 extending from the exterior of the sleeve member, through the upper portion 172, lower portion 174, and/or optional sidewalls 176 and 178, to the cavity 110. The holes 190 may be configured for securing hardware (e.g., pins, screws, bolts, etc.) to connect the electronic device structure 100 (see FIG. 1) to another structure, such as, for example, a drive bay of a computer case. In some embodiments, the holes 190 may be threaded to engage with a correspondingly threaded hardware.

Such a configuration of the frame 108 (see FIG. 3) and sleeve member 106 may enable more economical use of strong, corrosion-resistant, durable materials for the sleeve member 106. For example, the sleeve member 106 may include a metal material. More specifically, the sleeve member 106 may include extruded aluminum, which may require minimal machining to achieve the final configuration of the sleeve member 106.

Figure 5:
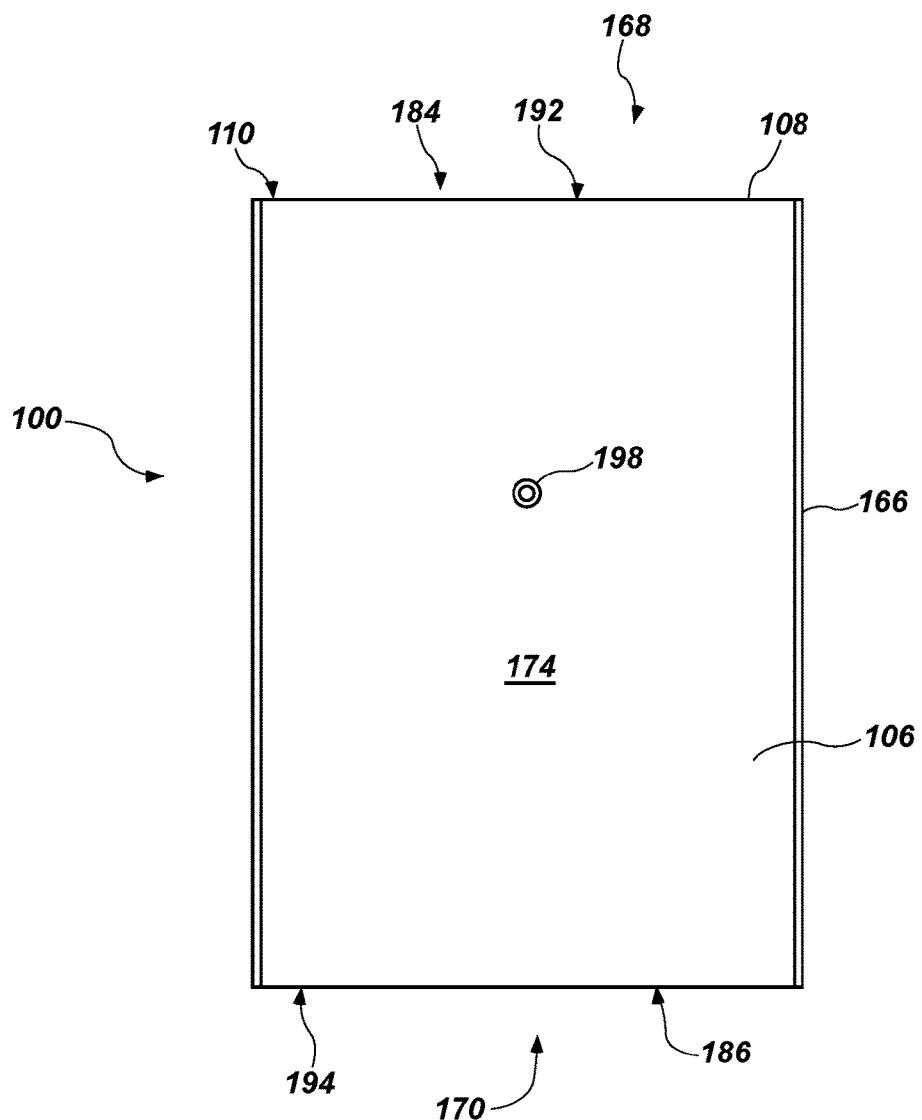
FIG. 5 is a bottom view of the electronic device of FIG. 1.

FIG. 5 is a bottom view of the electronic device structure 100 of FIG. 1. The frame 108 may be of the same length as, or smaller length than, the sleeve member 106, such that the frame 108 may not protrude beyond the sleeve member 106 when the frame 108 is inserted into the cavity 110. More specifically, the first surface 184 of the frame 108 may be at least substantially coplanar with a corresponding first end 192 of the body 166 of the sleeve member 106 at the first end 168, and the second surface 186 of the frame 108 may be at least substantially coplanar with a corresponding second end 194 of the body 166 of the sleeve member 106 at the second end 170.

In some embodiments, such as that shown in FIGS. 1 through 5, the frame 108 and sleeve member 106 may lack means for directly, mechanically securing the frame 108 to the sleeve member 106. For example, the frame 108 may only be indirectly mechanically secured to the sleeve member 106 via the electronic device member 102 (see FIG. 2). For example, the sleeve member 106 may include a hole 198 sized, shaped, and positioned to enable securing hardware to extend through the hole 198 to engage with the hole 132 (see FIG. 2) in the substrate 112 (see FIG. 2) of the electronic device member 102 (see FIG. 2). More specifically, the hole 198 may be a countersunk hole to enable a pin, screw, bolt, etc., to be inserted flush with the lower portion 174 and engage with the hole 132 to directly secure the electronic device member 102 (see FIG. 2) to the sleeve member 106, thereby indirectly securing the frame 108, which may be secured to the electronic device member 102 (see FIG. 2) utilizing the notches 122 (see FIG. 2) and retaining connectors 154 (see FIG. 3), to the sleeve member 106.

Figure 6:
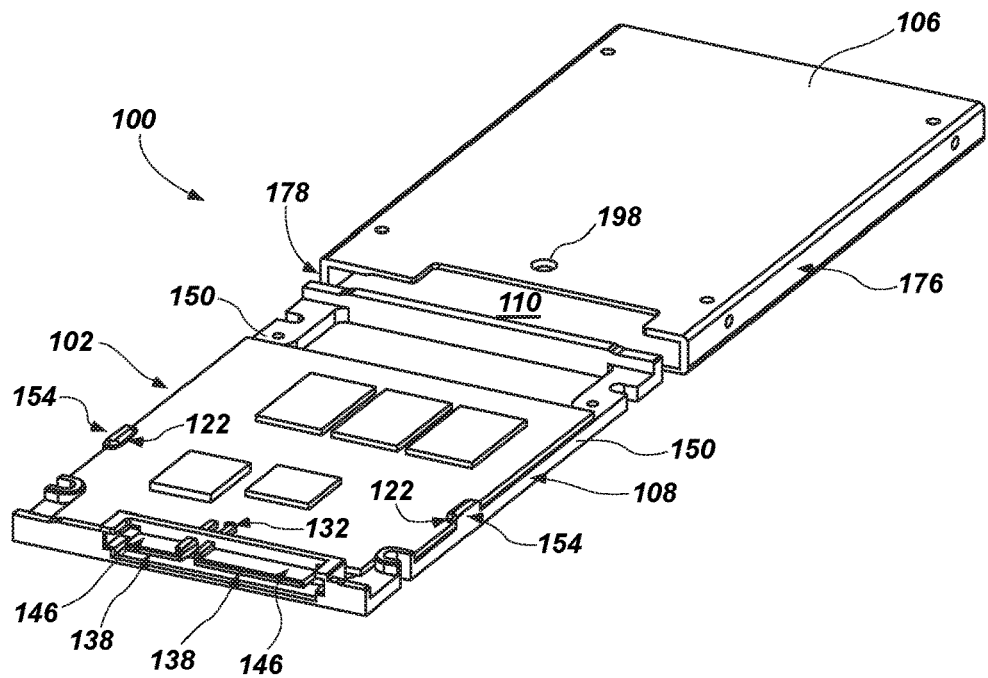
FIG. 6 is a partially exploded, perspective view of the electronic device of FIG. 1.

FIG. 6 is a partially exploded, perspective view of the electronic device of FIG. 1. When making or assembling the electronic device structure 100, the blades 138 of the electronic device member 102 may be inserted through the corresponding slots 146 in the frame 108. The support members 150 of the frame 108 may flex laterally outward and then resiliently return toward their original shape to engage the retaining connectors 154 with the notches 122 to secure the electronic device member 102 to the frame 108.

The frame 108 and electronic device member 102 may then be inserted into the cavity 110 of the sleeve member 106. The support members 150 of the frame 108 may be positioned to extend proximate the sidewalls 176 and 178 of the sleeve member 106 partially defining the cavity 110 when the frame 108 is located at least partially in the cavity 110. More specifically, the support members 150 may abut against the inner surfaces of sidewalls 176 and 178 of the sleeve member 106 when the frame 108 is located at least partially in the cavity 110. The proximity or contact between the support members 150 and the sidewalls 176 and 178 may prevent or minimize any subsequent bending, warpage, or movement of the support members 150, rendering the connection between the retaining connectors 154 and the notches 122 more secure.

Finally, the electronic device member 102 may be mechanically secured to the sleeve member 106 by inserting retaining hardware into the hole 198 in the sleeve member 106 and engaging the retaining hardware with the corresponding hole 132 in the electronic device member 102.

Figure 7:
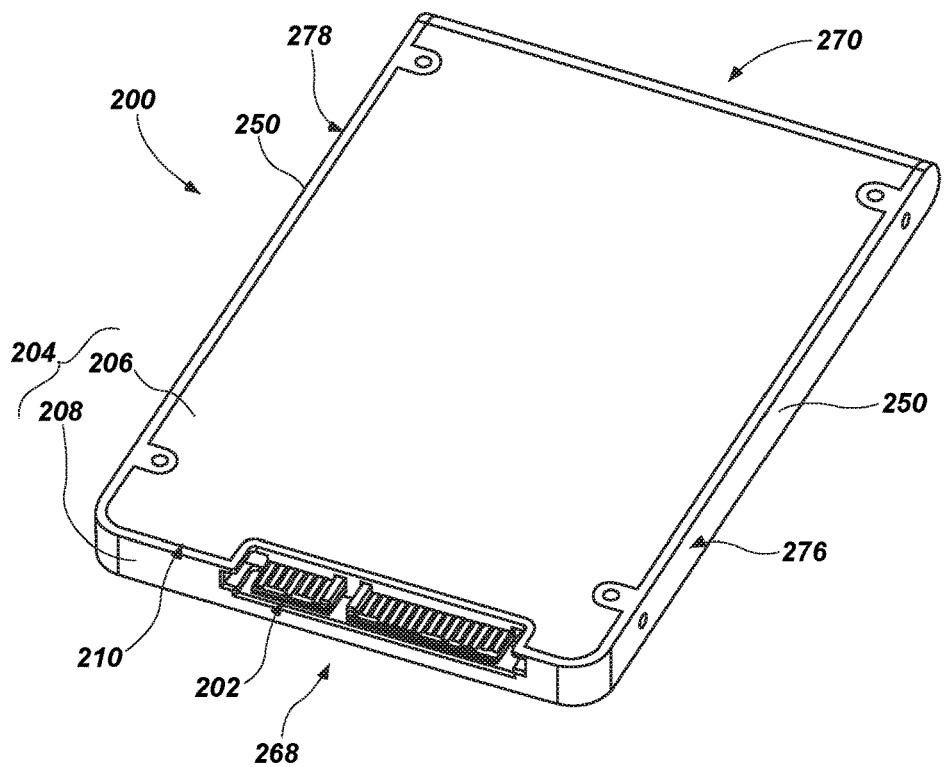
FIG. 7 is a perspective view of another embodiment of an electronic device.

FIG. 7 is a perspective view of another embodiment of an electronic device structure 200. The electronic device structure 200 may include many of the same structures, materials, and configurational techniques employed in the electronic device structure 100 of FIG. 1. Selected differences between the electronic device structures 200 and 100 (see FIG. 1) are described below.

In some embodiments, such as that shown in FIG. 7, the frame 208 may be exposed to an exterior of the electronic device structure 200 at positions other than the first and second ends 268 and 270 of the sleeve member 206. For example, the frame 208 may be exposed at, and may define the structure of, the sidewalls 276 and 278 of the enclosure 204. In such an embodiment, the support members 250 may also function as the sidewalls 276 and 278 of the enclosure 204. The frame 208 may further be exposed at the first end 268.

Figure 8:
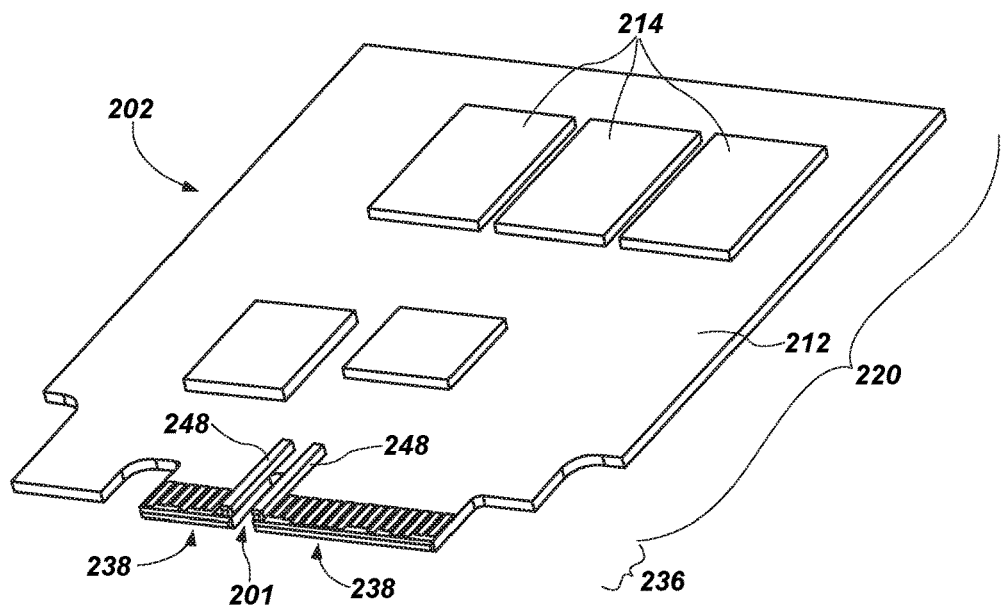
FIG. 8 is a perspective view of an electronic device member of the electronic device of FIG. 7.

FIG. 8 is a perspective view of the electronic device member 202 of the electronic device structure 200 of FIG. 7. As shown in FIG. 8, the number, size, type, material, and function of the electronic components 214 supported on, and electrically connected to, the substrate 212 of the electronic device member 202 may vary from application to application.

Figure 10:
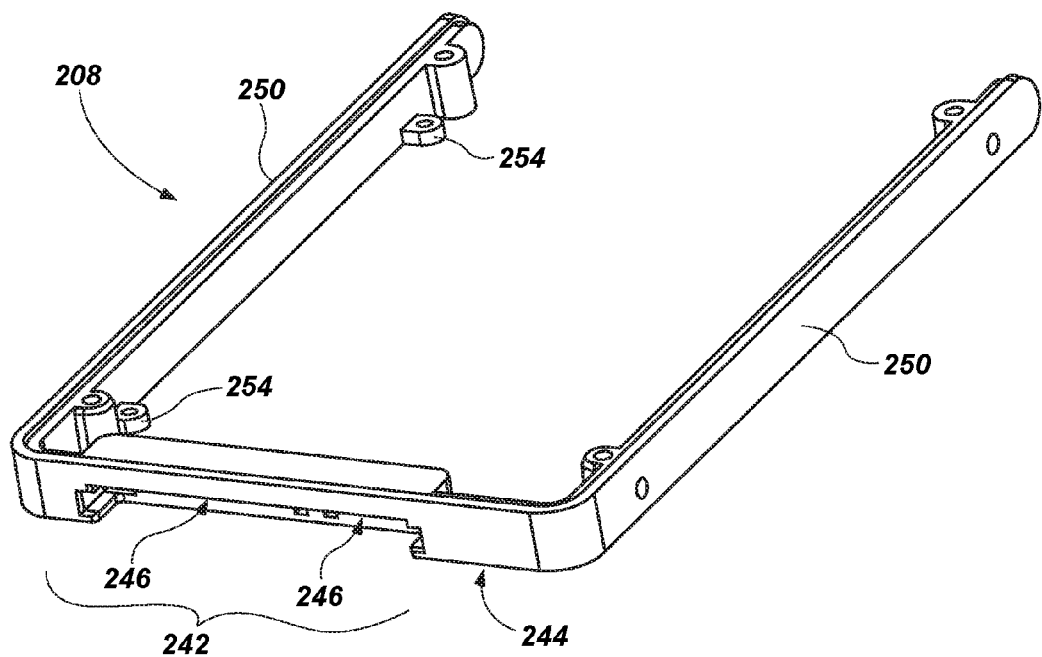
FIG. 10 is a perspective view of a frame of the electronic device of FIG. 7.

In addition, the guide tabs 248 may be positioned on the substrate 212 of the electronic device member 202, rather than on the connector interface 242 (see FIG. 10) of the frame 208 (see FIG. 10). For example, the guide tabs 248 may be laterally separated by a gap 201 between the blades 238. The guide tabs 248 may extend longitudinally from the first portion 220 of the substrate 212 onto the second portion 236 of the substrate 212, terminating at least substantially flush with the terminal ends of the blades 238.

Figure 9:
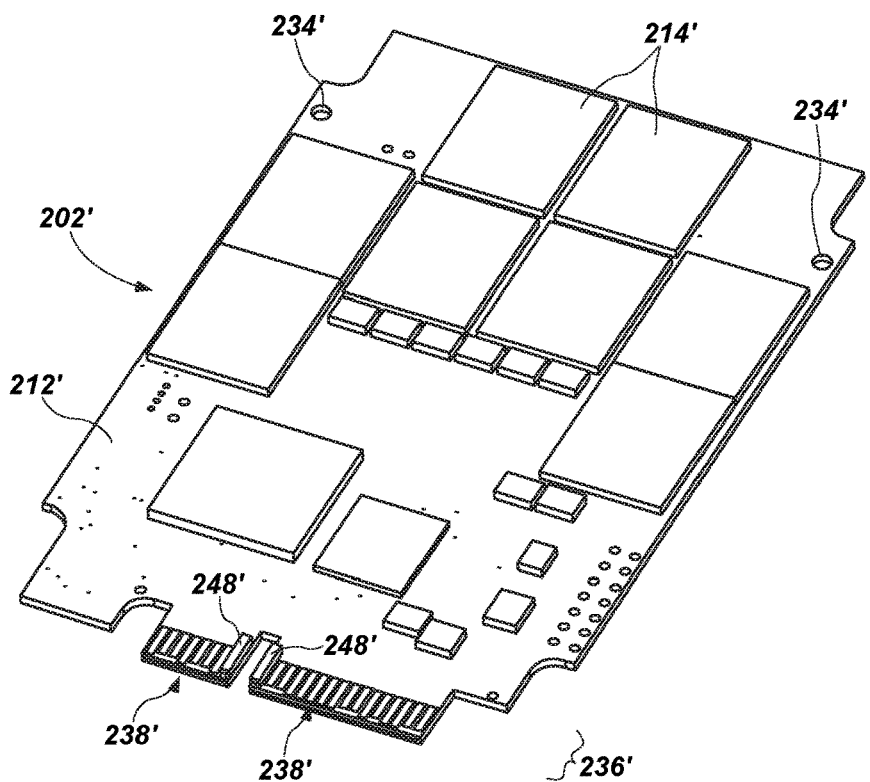
FIG. 9 is a perspective view of another embodiment of an electronic device member usable with the electronic device of FIG. 7.

FIG. 9 is a perspective view of another embodiment of an electronic device member 202' suitable to fabricate the electronic device structure 200 of FIG. 7. Again, the number, size, type, material, and function of the electronic components 214' supported on, and electrically connected to, the substrate 212' of the electronic device member 202' may vary from application to application, and any method of packaging the various components for assembly into the resulting electronic devices of embodiments of the disclosure is suitable, within length, width, and height limitations, for use with the substrate, frame, and sleeve member enclosure configurations disclosed in this application.

As with the previous embodiment the guide tabs 248' may be positioned on the substrate 212' of the electronic device member 202', rather than on the connector interface 142 (see FIG. 3) of the frame 108 (see FIG. 3). Here, the guide tabs 248' may be confined to the second portion 236', such that they may extend longitudinally only within second portion 236', terminating at least substantially flush with the terminal ends of the blades 238'.

FIG. 10 is a perspective view of a frame 208 of the electronic device structure 200 of FIG. 7. In some embodiments, such as that shown in FIG. 10, the frame 208 may lack a backstop 164 (see FIG. 3). In such embodiments, the frame 208 may be limited to the first end 244 and mutually parallel support members 250 extending perpendicular to the first end 244, such that the frame 208 may exhibit a "U" shape.

In some embodiments, the retaining connectors 254 may be configured as, for example, holes configured to receive securing hardware extending through corresponding holes 234' (see FIG. 9) in the electronic device member 202' (see FIG. 9) to directly, mechanically secure the electronic device member 202' (see FIG. 9) to the frame 208.

In embodiments where the guide tabs 248, 248' are positioned on the electronic device member 202 (see FIGS. 8 and 9), the frame 208 may lack the integrated guide tabs 148 (see FIG. 1) of the previous embodiment.

Figure 11:
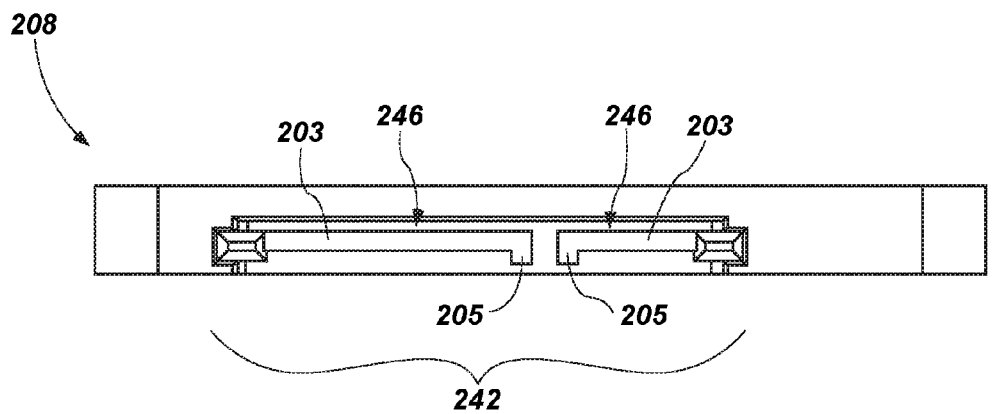
FIG. 11 is a front view of the frame of the electronic device of FIG. 7.

FIG. 11 is a front view of the frame 208 of the electronic device structure 200 of FIG. 7. To accommodate the guide tabs 248, 248' (see FIGS. 8 and 9), the slots 246 extending through the frame 208 may be "L" shaped. More specifically, each slot 246 may include a laterally extending portion 203 sized and shaped to permit the blade 238 (see FIG. 8) to extend therethrough and a downwardly extending portion 205 at an end of the laterally extending portion 203, the downwardly extending portion 205 sized and shaped to permit the guide tab 248, 248' to extend therethrough when substrate 212, 212' is inverted from the positions shown in FIGS. 8 and 9.

Figure 12:
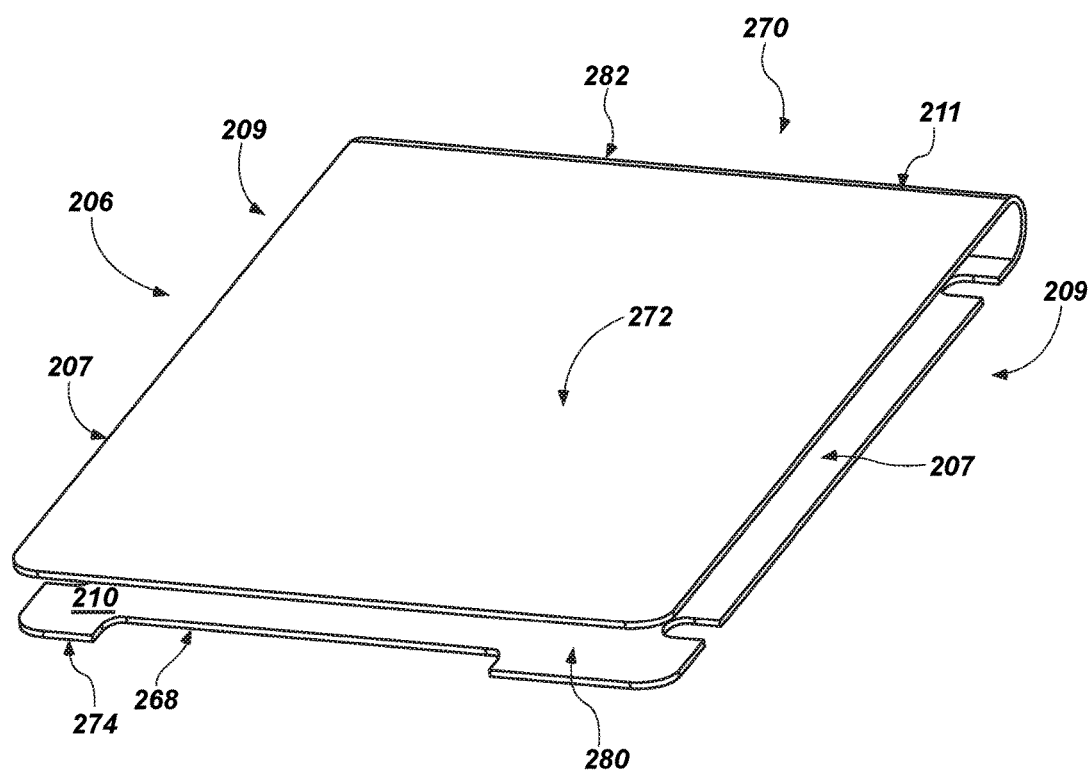
FIG. 12 is a perspective view of an enclosure of the electronic device of FIG. 7.

FIG. 12 is a perspective view of the sleeve member 206 of the electronic device structure 200 of FIG. 7. In embodiments where the frame 208 is exposed along the sidewalls 276 and 278 (see FIG. 7), the sleeve member 206 may include a first opening segment 280 at the first end 268 of the sleeve member 206 and side opening segments 207 contiguous with first opening segment 280 at the lateral portions 209 of the sleeve member 206. The sleeve member 206 may include mutually parallel upper and lower portions 272 and 274 and may further include a rear portion 211 extending between upper and lower portions 272 and 274 covering the second end 270 of the sleeve member 206. Thus, sleeve member 206 may lack the other opening 182 (see FIG. 4) at the second end 270. In such an embodiment, support members 250 of frame 208 may, when frame 208 is positioned within sleeve member 206, provide sidewalls for the cavity 210 enclosing an electronic device member 202, 202' engaged with frame 208 and abut rear portion 211 of sleeve member 206. In embodiments where the electronic device structure 200 is configured to perform another function requiring introduction of another medium into the electronic device structure 200, such as, for example, inserting a DVD or CD into the corresponding drive, the rear portion 211 may be configured with an opening appropriately sized and shaped to receive the particular medium.

By selectively integrating portions of components of an electronic device into other portions thereof, the resulting electronic device may be made and assembled more cost-effectively, may enable the use of higher-quality, more durable materials, may simplify manufacturing and assembly procedures through reduction in parts inventory and reduction in connections requiring soldering, may reduce assembly weight, and may result in a more secure connection between the various components. In addition, the resulting electronic device may improve signal speed and fidelity.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

What is claimed is:

1. An electronic device structure, comprising:
a sleeve member comprising a body, a cavity extending from a first end of the body toward a second end of the body, opposite the first end, and an opening in communication with the cavity at the first end of the body of the sleeve member; and
a frame configured to engage an electronic device member positioned at least partially in the cavity, the frame comprising:
a connector interface at a first end of the frame, the connector interface at least partially occluding the opening at the first end of the body of the sleeve member, the connector interface being a Serial Advanced Technology Attachment (SATA) interface sized and shaped to mate with a mating connector to form an operative connection with the electronic device member engaged with the frame, wherein the connector interface comprises at least one slot sized and shaped to enable a portion of the electronic device member engaged with the frame to extend therethrough; and
support members extending perpendicular to the connector interface from proximate the connector interface at the first end of the frame to proximate the second end of the body of the sleeve member at a second end of the frame, opposite the first end along opposing sides of the cavity.

2. The structure of claim 1, wherein the sleeve member comprises an upper portion, a lower portion and opposing sidewalls, and the cavity extends through the sleeve member to another opening in communication at the second end of the body of the sleeve member and the frame comprises a backstop at the second end of the frame, the backstop at least partially occluding the other opening.

3. The structure of claim 2, wherein at least one of the upper portion and the lower portion of the sleeve member includes a cutout at the first end of the body of the sleeve member substantially aligned with the connector interface.

4. The structure of claim 2, wherein the support members abut against the sidewalls of the sleeve member.

5. The structure of claim 2, wherein a first surface of the connector interface sized and shaped to occlude at least a portion of the opening is positioned at least substantially coplanar with a corresponding first end of the body of the sleeve member at the first end and a second surface of the backstop at least partially occluding the other opening is positioned at least substantially coplanar with a corresponding second end of the body of the sleeve member.

6. The structure of claim 1, wherein each support member comprises a retaining connector located and configured to engage with a notch on a corresponding side of the electronic device member engaged with the frame.

7. The structure of claim 1, wherein the connector interface exhibits a size and configuration specified in at least one of SATA Specification Revisions 1.0, 2.0, 3.0, 3.2, and 3.3.

8. The structure of claim 7, wherein guide tabs in accordance with the at least one of SATA Specification Revisions 1.0, 2.0, 3.0, 3.2, and 3.3 are located on the connector interface of the frame.

9. The structure of claim 7, wherein the connector interface of the frame lacks guide tabs in accordance with the at least one of SATA Specification Revisions 1.0, 2.0, 3.0, 3.2, and 3.3.

10. The structure of claim 1, wherein the sleeve member lacks means for directly securing the sleeve member to the frame.

11. The structure of claim 1, wherein the electronic device member comprises a substrate engaged with the frame and bearing electronic components, and an extending portion of the electronic device member comprises a portion of the substrate configured as at least one blade including electrical contacts thereon.

12. The structure of claim 11, wherein each support member comprises a retaining connector engaged with a notch on a corresponding side of the substrate.

13. The structure of claim 11, wherein guide tabs in accordance with the at least one of SATA Specification Revisions 1.0, 2.0, 3.0, 3.2, and 3.3 are located on the portion of the substrate configured as at least one blade.

14. The structure of claim 11, wherein the at least one blade exhibits a size and configuration as specified in at least one of SATA Specification Revisions 1.0, 2.0, 3.0, 3.2, and 3.3.

15. The structure of claim 1, wherein the sleeve member comprises an upper portion, a lower portion and a rear portion at the second end of the body of the sleeve member, and the support members extend between the upper portion and the lower portion from the first end of the body of the sleeve member to the rear portion thereof.

16. The structure of claim 15, wherein the support members comprise sidewalls of the sleeve member.

17. The structure of claim 15, wherein a first surface of the connector interface sized and shaped to occlude at least a portion of the opening is positioned at least substantially coplanar with a corresponding first end of the body of the sleeve member at the first end and ends of the support members abut the rear portion of the sleeve member.

18. The structure of claim 15, wherein the electronic device member comprises a substrate engaged with the frame and bearing electronic components, and an extending portion of the electronic device member comprises a portion of the substrate configured as at least one blade including electrical contacts thereon.

19. The structure of claim 18, wherein guide tabs in accordance with the at least one of SATA Specification Revisions 1.0, 2.0, 3.0, 3.2, and 3.3 are located on the portion of the substrate configured as at least one blade.

20. The structure of claim 18, wherein the at least one blade exhibits a size, shape, and configuration as specified in at least one of SATA Specification Revisions 1.0, 2.0, 3.0, 3.2, and 3.3.

21. The structure of claim 15, wherein the connector interface exhibits a size, shape, and configuration specified in at least one of SATA Specification Revisions 1.0, 2.0, 3.0, 3.2, and 3.3.

22. The structure of claim 15, wherein guide tabs in accordance with the at least one of SATA Specification Revisions 1.0, 2.0, 3.0, 3.2, and 3.3 are located on the connector interface of the frame.

23. The structure of claim 15, wherein the connector interface of the frame lacks guide tabs in accordance with the at least one of SATA Specification Revisions 1.0, 2.0, 3.0, 3.2, and 3.3.

24. The structure of claim 15, wherein at least one of the upper portion and the lower portion of the sleeve member includes a cutout at the first end of the body of the sleeve member substantially aligned with the connector interface.

25. The structure of claim 1, wherein the sleeve member is directly secured to the frame.

26. A method of making an electronic device structure, comprising:
   positioning a frame at least partially in a cavity extending into a sleeve member, the frame comprising a connector interface at a first end and support members extending from proximate the connector interface at the first end of the body of the sleeve member to a second end of the frame, opposite the first end, at a second end of the body, opposite the first end, to place the support members proximate opposing sides of the cavity and at least partially occlude an opening of the cavity at a first end of the body of the sleeve member with the connector interface, the connector interface being a Serial Advanced Technology Attachment (SATA) interface; and
   engaging a substrate of an electronic device member with the frame and extending a portion of the substrate configured as at least one blade bearing electrical contacts through at least one corresponding aperture in the connector interface before positioning the frame at least partially within the cavity of the sleeve member.

27. The method of claim 26, wherein positioning the frame at least partially in the cavity comprises abutting the support members of the frame against sidewalls of the sleeve member.

28. The method of claim 26, wherein the cavity extends through the sleeve member to another opening in communication with the cavity at the second end of the body of the sleeve member, the frame comprises a backstop, and positioning the frame at least partially in the cavity comprises positioning a first end of the connector interface at least partially occluding the opening at least substantially coplanar with a corresponding first surface of the sleeve member at the first end of the body of the sleeve member and positioning a second surface of the backstop to occlude at least a majority of the other opening at least substantially coplanar with a corresponding second end of the body of the sleeve member at the second end.

29. The method of claim 26, wherein the sleeve member comprises an upper portion, a lower portion and a rear portion comprising a second end of the body of the sleeve member, and positioning the frame further comprises placing the support members between the upper and lower portions of the sleeve member to define sidewalls of the cavity and abut the rear portion of the sleeve member.

* * * * *